(12) United States Patent
Moharir (10) Patent No.: US 9,653,150 B1
(45) Date of Patent: May 16, 2017

(54) STATIC RANDOM ACCESS MEMORY (SRAM) BITCELL AND MEMORY ARCHITECTURE WITHOUT A WRITE BITLINE

(71) Applicant: Skan Technologies Corporation, Willowbrook, IL (US)

(72) Inventor: Sudhir S. Moharir, Bangalore (IN)

(73) Assignee: SKAN TECHNOLOGIES CORPORATION, Willowbrook, IL (US)

( * ) Notice: Subject to any disclaimer, the term of this patent is extended or adjusted under 35 U.S.C. 154(b) by 0 days.

(21) Appl. No.: 15/090,850

(22) Filed: Apr. 5, 2016

Related U.S. Application Data

(62) Division of application No. 14/519,468, filed on Oct. 21, 2014, now Pat. No. 9,336,861.

(60) Provisional application No. 62/036,189, filed on Aug. 12, 2014.

(51) Int. Cl.
*G11C 11/417* (2006.01)

(52) U.S. Cl.
CPC ............................... *G11C 11/417* (2013.01)

(58) Field of Classification Search
CPC .................................................. G11C 11/417
See application file for complete search history.

(56) References Cited

U.S. PATENT DOCUMENTS

| 7,696,649 B2 * | 4/2010 | Frey | H03K 17/28 |
| | | | 307/139 |
| 2012/0117409 A1 * | 5/2012 | Lee | G06F 1/26 |
| | | | 713/340 |

* cited by examiner

*Primary Examiner* — Tri Hoang
(74) *Attorney, Agent, or Firm* — Anderson Gorecki LLP (57) ABSTRACT

A bit cell and memory architecture wherein a write bitline is not required is presented. The bitcell and the memory architecture bring a huge improvement in the performance, dynamic power, leakage power, area, and the yield of the memory.

5 Claims, 6 Drawing Sheets

STATIC RANDOM ACCESS MEMORY (SRAM) BITCELL AND MEMORY ARCHITECTURE WITHOUT A WRITE BITLINE

CROSS REFERENCE TO RELATED APPLICATIONS

The present application is a divisional of U.S. patent application Ser. No. 14/519,468 filed on Oct. 21, 2014 which claims the benefit of U.S. Provisional Patent Application No. 62/036,189, filed on Aug. 12, 2014, which is incorporated herein by reference in its entirety.

BACKGROUND

Traditional memory bit cells are well known and widely used. In a conventional six transistor (6T) bitcell, in order to write into the bitcell, a Write Line (WL) needs to go high and the zero is written either from the Bit Line (BL) or the Bit Line Bar (BLB) side by pulling either the BL or the BLB low depending on the data. The READ happens by sensing the differential between the BL and BLB when the WL goes high. In a conventional eight transistor (8T) bitcell the WRITE operation is same as in the 6T bitcell. The READ operation happens when the RWL goes high. The RBL is precharged high. If the node B is high, then the RBL will go low, otherwise it will stay high.

In recent or future technologies, if a write assist technique is needed for the proposed bitcell and the memory architecture also, a way of providing the write-assist locally within this architecture is required. All the previous write-assist techniques dealt with an idea of making the writing "easier" in the bitcell, either by reducing the bitcell supply voltage, or by using the negative bitline concept, or by boosting the wordline voltage.

Also known is the fact that in power-down mode, the voltage on the power rail capacitance goes down significantly. When the memory or any other circuit goes back to the active mode, this power rail capacitance needs to charge back to VDD. If this charging is sudden, then it draws a huge current from the power supply and the in-rush current is huge and many times, exceeds the rating that can be handled at the system on a chip (SOC) level. There have been some ways of controlling the in-rush current, like using a smaller P-channel Metal Oxide Semiconductor (PMOS) header, using a smaller PMOS header first which is then followed by a larger PMOS header, by introducing delays between the gate controls of the PMOS headers so that they turn ON in a staggered way. Introducing the delays using any delay elements is not possible as the gate delays are very small as compared to the total delay requirement.

SUMMARY

Conventional memory bit cells suffer from a number of deficiencies as recited above. Embodiments of the invention significantly overcome such deficiencies by providing a bitcell and memory architecture without a write bitline.

In the earlier memory bitcell architectures, in order to accomplish a write to the bit cell a write bitline, a write column mux comprised of the NMOS pass transistors, and a write driver were required. As the write driver had to drive the bitline through the write mux pass transistor, the size of the write driver needed to be bigger and the statistical analysis had to be carried out on the combination of bitline RC, write mux and the write driver. This increased the problem of writing into the bitcell and contributed to the necessity of the write-assist techniques. In accordance with the present invention, the writing into the bitcell is now made simple and local to the bitcell, and there would be many technology nodes where the necessity of the write-assist techniques will not be there. So we have also taken care of the write-assist requirement. Also disclosed is a novel way of write-assist technique which is correct by construction, as well as a technique to reduce the in-rush current of the memories or any semiconductor circuits in general.

In summary, the proposed new bitcell and the memory architecture bring a huge improvement in the performance, dynamic power, leakage power, area requirements, and the yield of the memory.

Note that each of the different features, techniques, configurations, etc. discussed in this disclosure can be executed independently or in combination. Accordingly, the present invention can be embodied and viewed in many different ways. Also, note that this summary section herein does not specify every embodiment and/or incrementally novel aspect of the present disclosure or claimed invention. Instead, this summary only provides a preliminary discussion of different embodiments and corresponding points of novelty over conventional techniques. For additional details, elements, and/or possible perspectives (permutations) of the invention, the reader is directed to the Detailed Description section and corresponding figures of the present disclosure as further discussed below.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The embodiments set forth below represent the necessary information to enable those skilled in the art to practice the invention and illustrate the best mode of practicing embodiments of the invention. Upon reading the following description in light of the accompanying figures, those skilled in the art will understand the concepts of the invention and recognize applications of these concepts not particularly addressed herein. It should be understood that these concepts and applications fall within the scope of the disclosure and the accompanying claims.

The preferred embodiment of the invention will now be described with reference to the accompanying drawings. The invention may, however, be embodied in many different forms and should not be construed as limited to the embodiment set forth herein; rather, this embodiment is provided so that this disclosure will be thorough and complete, and will fully convey the scope of the invention to those skilled in the art. The terminology used in the detailed description of the particular embodiment illustrated in the accompanying drawings is not intended to be limiting of the invention. In the drawings, like numbers refer to like elements.

Figure 1:
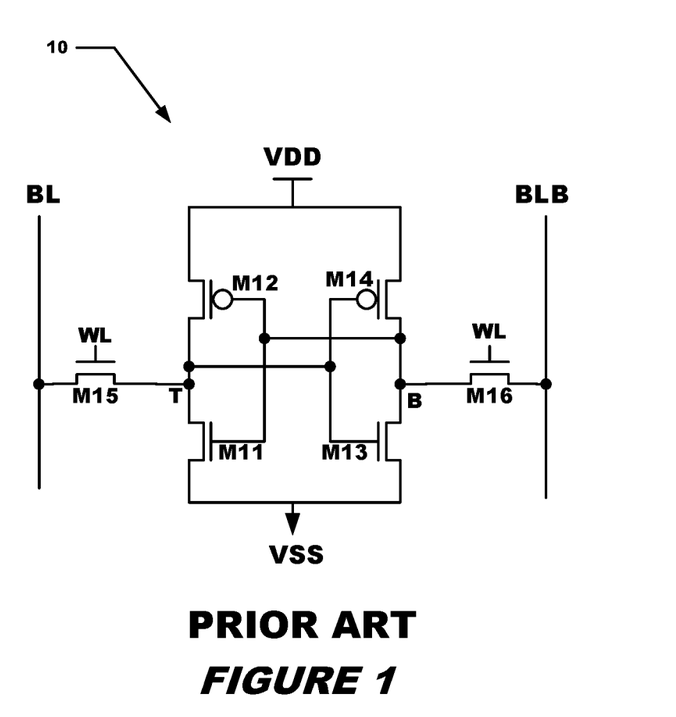
FIG. 1 depicts a schematic diagram of a conventional 6T bitcell.

Referring to FIG. 1, a conventional 6T bit cell 10 is shown. As shown in FIG. 1, transistor M11 has a gate coupled to a gate of M12, a drain of M13, and a drain of M14 (node B). M11 also has a source connected to ground (VSS) and a drain coupled to a drain of M12, a gate of M13 and a gate of M14 (node T). Bit cell 10 also includes M12 having a source coupled to a positive reference voltage (VDD). M13 has a source coupled to VSS. M14 has a source coupled to VDD.

Also included are M15 and M16. M15 has a gate coupled to WL, a drain coupled to BL and a source coupled to the drain of M11. M16 has a gate coupled to WL, a drain coupled to BLB and a source coupled to the drain of M13.

To write into the bit cell 10, the Word line (WL) needs to go high turning on M15 and M16. A zero is written either from the Bit Line (BL) or the Bit Line Bar (BLB) side by pulling either the BL or the BLB low depending on the data. The READ happens by sensing the differential between the BL and BLB when the WL goes high.

Figure 2:
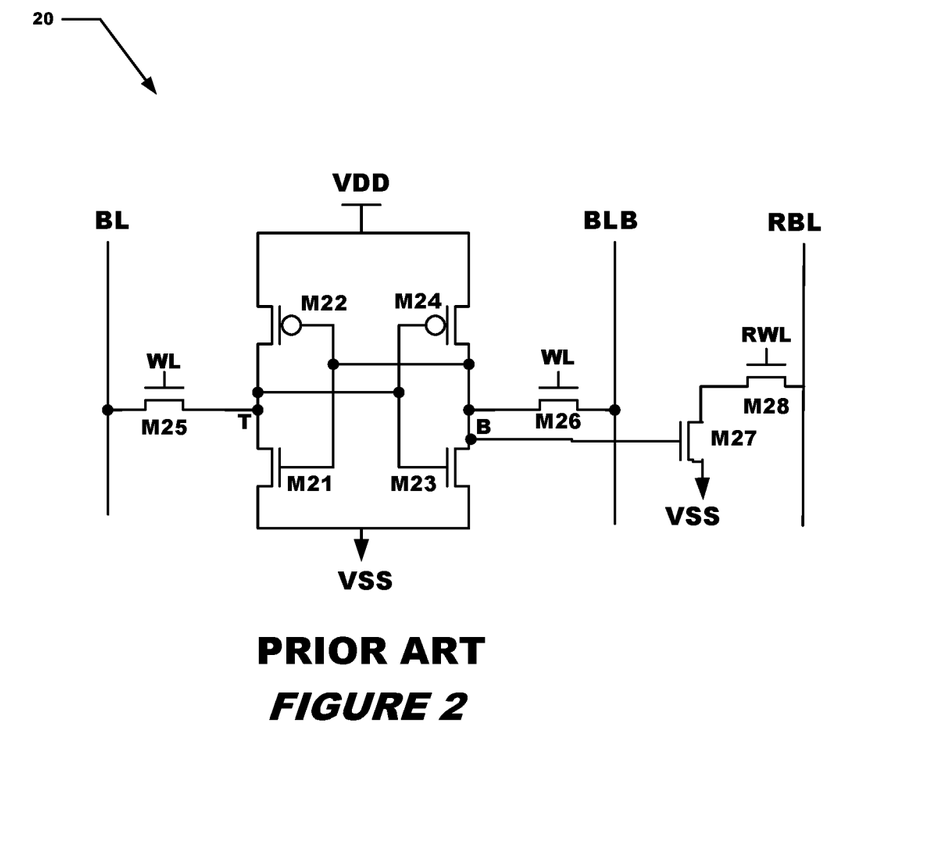
FIG. 2 depicts a schematic diagram of a conventional 8T bitcell.

FIG. 2 shows a conventional 8T bit cell 20. As shown in FIG. 2, transistor M21 has a gate coupled to a gate of M22, a drain of M23, and a drain of M24 (node B). M21 also has a source connected to ground (VSS) and a drain coupled to a drain of M22, a gate of M23 and a gate of M24 (node T). Bit cell 20 also includes M22 having a source coupled to a positive reference voltage (VDD). M23 has a source coupled to VSS. M24 has a source coupled to VDD.

Also included are M25 and M26. M25 has a gate coupled to WL, a drain coupled to BL and a source coupled to the drain of M21. M26 has a gate coupled to WL, a drain coupled to BLB and a source coupled to the drain of M23. 8T bit cell 20 further includes M27 and M28. M27 has a gate coupled to node B, a source coupled to VSS and a drain coupled to a source of M28. M28 has a gate coupled to a Read Word Line (RWL) and a drain coupled to a Read Bit line (RBL).

A WRITE operation for the 8T bit cell is the same as in the 6T bit cell described above. The READ operation happens when the RWL goes high. The RBL is precharged high. If the node B is high, then the RBL will go low by being pulled down to VSS through M27, otherwise RBL will stay high.

A new design for a bitcell to store the data in SRAMs is presented. This bitcell does not have a "write bitline" that is used to write into the bitcell as in all the previous bitcells. As the bitline itself is not required, there is no need for a write driver and the circuitry related to the bitline precharge. The memory architectures using this new bitcell will not require a write driver as well as the precharge circuitry related to the write bitline. This saves a lot of area that would otherwise be occupied by this circuitry. As the bitline is not there, the issue of the bitline leakage is also not there. As the bitline is not there, the dynamic power that is consumed in the charging and discharging of the bitline is also not consumed. So in short, the present invention results in savings in area, dynamic power, and leakage power. As the writing happens locally in the bitcell, it is faster and more robust. This means that there are speed improvements in the write operation and also improvements in the robustness of the write operation.

In the conventional memory bitcell and the architectures, one has to have circuitry that uses the techniques to take care of the read-disturb conditions. This is becoming more and more necessary in the latest technologies. Read-disturb condition happens when the wordline turns ON for a given row and the column is not selected. The problem is increased if the unselected bitline is held high as we are not writing from that column. As the wordline turns ON, the node "B" rises due to the voltage divider action between the passgate and the pulldown of the bitcell. In the recent bitcells where the beta ratio (size of pulldown/size of passgate) of the bitcell is reducing, this problem becomes more critical. In the proposed bitcell and the memory architecture, the read-disturb problem does not exist. Throughout the whole array, only the single bitcell that is being written into, is exposed to the outside influence. The remaining bitcells are completely stable as either the wordline (WL) or the dataline (DL) and datalinebar (DLB) are OFF. The presently described bitcell and the memory architecture are immune to the problem of the read-disturb. This means that the memory is more robust and the circuitry related to the read-disturb is not required, therefore saving the area.

As explained in the above paragraph, the bitcell is immune to the read-disturb condition. In the earlier bitcells, the pulldown transistor needed to be big to maintain a minimum beta ratio so that the bitcell is stable. In the proposed bitcell, as the requirement of a bigger pulldown is not there, the size of the pulldown can be reduced; this will result in a smaller bitcell.

Figure 3:
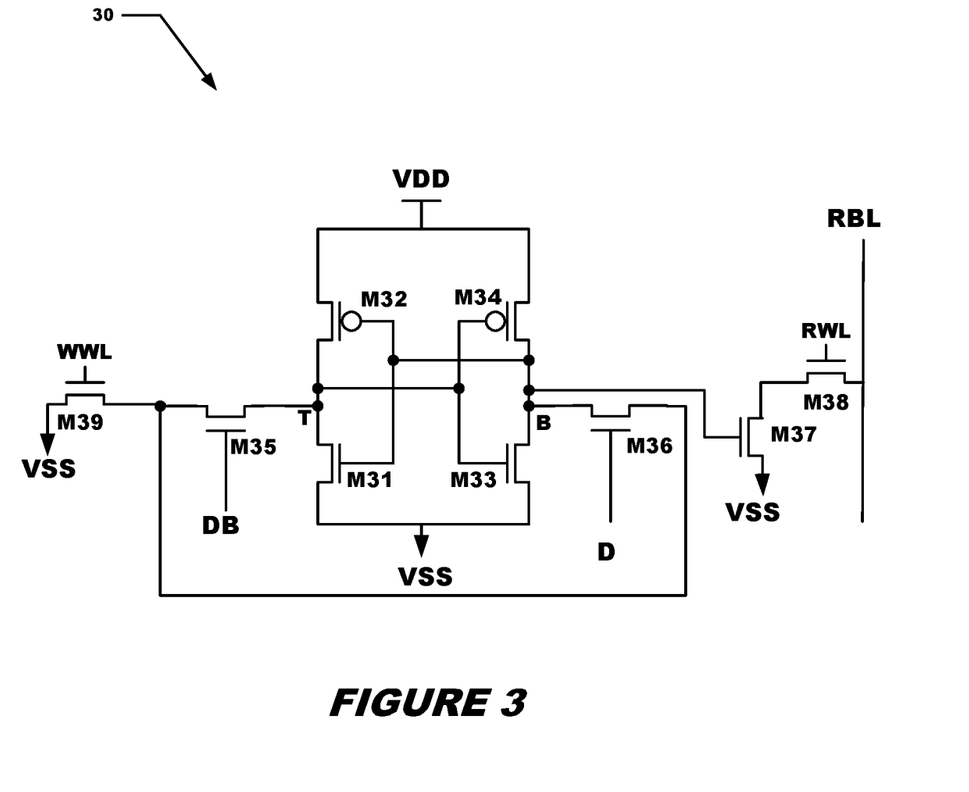
FIG. 3 depicts a schematic diagram of a first embodiment of a bitcell in accordance with a particular embodiment of the present invention.

FIG. 3 shows a new bit cell 30 in accordance with the present invention. As shown in FIG. 3, transistor M31 has a gate coupled to a gate of M32, a drain of M33 and a drain of M34 (node B). M31 also has a source connected to VSS and a drain coupled to a drain of M32, a gate of M33 and a gate of M34 (node T). Bit cell 30 also includes M32 having a source coupled to VDD. M33 has a source coupled to VSS. M34 has a source coupled to VDD.

Also included are M35, M36, M37, M38 and M39. M35 has a gate coupled to Data Bar (DB), and a source coupled to a drain of M39 and to a source of M36. M35 further includes a drain coupled to node T. M36 has a gate coupled to Data (D) and a drain coupled to node B. M37 has a gate coupled to node B, a source coupled to VSS and a drain coupled to a source of M38. M38 has a gate coupled to a Read Word Line (RWL) and a drain coupled to a Read Bit line (RBL). M39 has a gate coupled to Write Word Line (WWL) and a source coupled to VSS.

When neither a READ nor a WRITE operation is happening, WWL (Write Word Line), DB (Data Bar), D (Data), and RWL (Read Word Line) are kept low. The READ operation stays the same as in FIG. 2. Note that there are no bitlines present related to the WRITE operation. To write into the bitcell, the WWL needs to go high and either DB or D will go high, depending on the data polarity. One end of the transistor M39 is always connected to the VSS. If WWL and DB are high, then the node T will be pulled low. If WWL and D are high, then the node B will be pulled low. This is how the WRITE into the bit cell is accomplished. The WRITE operation is made local to the individual bitcell. Note that a conventional write driver is not required and neither is a conventional write bitline. Accordingly, a write bitline precharge is not required. Even during a WRITE operation, either T or B will be exposed to the outside influence. Other bitcells on the same wordline WWL are not exposed to the outside influence because for those bitcells, both DB and D will be OFF. In the conventional bitcells, both T and B for all the bitcells on the wordline are exposed to the outside influence. The new bitcell and the new memory architecture have huge advantages over the previously existing bitcells which will be discussed later.

As shown in FIG. 3, there is only one pass transistor (M39) per bit cell that is connected to WWL. In conventional bitcells, there are two pass transistors per bitcell that are connected to the word line. This reduces the load on the wordline to almost half and in many cases, more than half. This will reduce the size of the wordline driver circuitry and also will make the memory faster.

Figure 4:
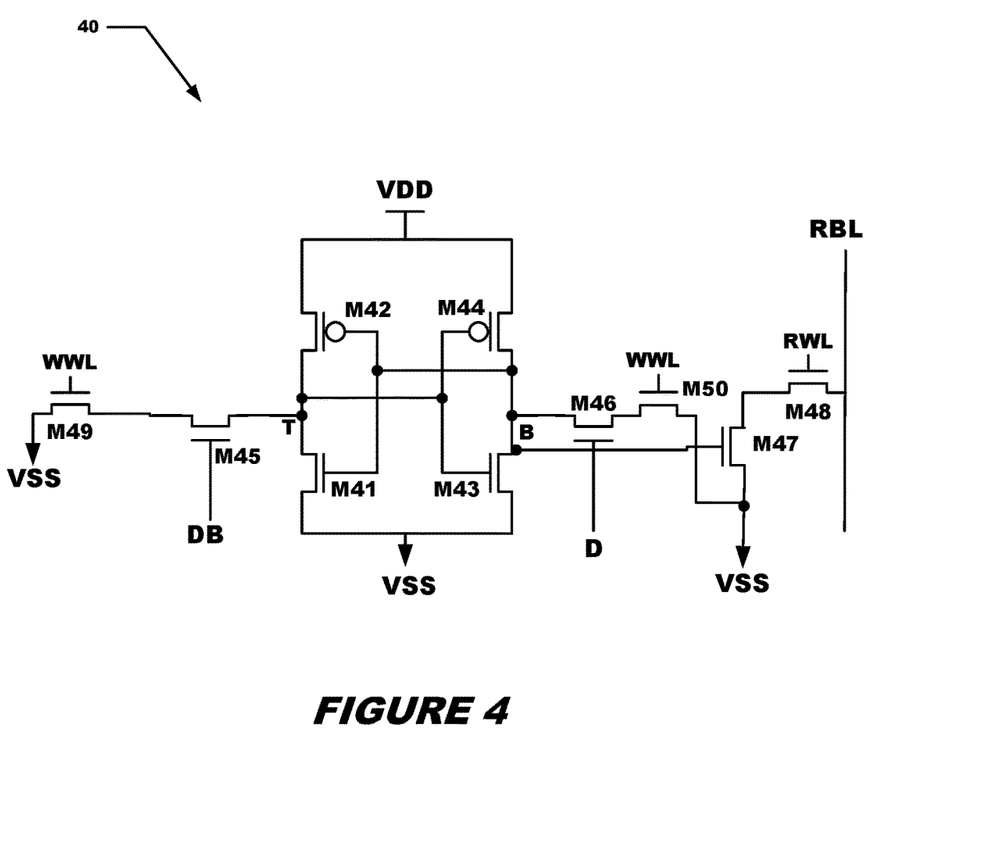
FIG. 4 depicts a schematic diagram of a second embodiment of a bitcell in accordance with a particular embodiment of the present invention.

FIG. 4 shows the new proposed bitcell which is same in principal as in FIG. 3, but has a slightly different topology. This topology will be useful if the foundries want to maintain better symmetry in the bitcell. Note that the node T will be pulled low through transistors M45 and M49 and the node B will be pulled low through transistors M46 and M50 in this topology. The new bitcell is still effectively same as in FIG. 3 because the logical operation remains the same. If WWL and DB are high, then the node T will be pulled low. If WWL and D are high, then the node B will be pulled low.

FIG. 4 shows a new bit cell 40 in accordance with the present invention. As shown in FIG. 4, transistor M41 has a gate coupled to a gate of M42, a drain of M43 and a drain of M44 (node B). M41 also has a source connected to VSS and a drain coupled to a drain of M42, a gate of M43 and a gate of M44 (node T). Bit cell 40 also includes M42 having a source coupled to VDD. M43 has a source coupled to VSS. M44 has a source coupled to VDD.

Also included are M45, M46, M47, M48, M49 and M50. M45 has a gate coupled to Data Bar (DB) and a source coupled to a drain of M49. M45 further includes a drain coupled to node T. M46 has a gate coupled to Data (D) and a drain coupled to node B. M47 has a gate coupled to node B, a source coupled to VSS and a drain coupled to a source of M48. M48 has a gate coupled to a Read Word Line (RWL) and a drain coupled to a Read Bit line (RBL). M39 has a gate coupled to Write Word Line (WWL) and a source coupled to VSS. M50 has a gate coupled to WWL, a drain coupled to a source of M46, and a source coupled to VSS.

When neither a READ nor a WRITE operation is happening, WWL (Write Word Line), DB (Data Bar), D (Data), and RWL (Read Word Line) are kept low. The READ operation stays the same as in FIG. 2. Note that there are no bit lines present related to the WRITE operation. To write into the bit cell, the WWL needs to go high and either DB or D will go high, depending on the data polarity. One end of the transistor M49 and transistor M50 is always connected to the VSS. If WWL and DB are high, then the node T will be pulled low. If WWL and D are high, then the node B will be pulled low. This is how the WRITE into the bit cell is accomplished. The WRITE operation is made local to the individual bit cell. Note that a conventional write driver is not required and neither is a conventional write bit line. Accordingly, a write bit line precharge is not required. Even during a WRITE operation, either T or B will be exposed to the outside influence. Other bit cells on the same word line WWL are not exposed to the outside influence because for those bit cells, both DB and D will be OFF. In the conventional bit cells, both T and B for all the bit cells on the word line are exposed to the outside influence. The new bit cell and the new memory architecture have huge advantages over the previously existing bit cells which will be discussed later.

As writing into the bitcell becomes more robust, we expect that the VMIN of the memory will go down. It means that the memories will be functional at a lower voltage as compared to the conventional bitcells. This is a great advantage, particularly for technologies that operate at lower supply voltages.

With the proposed new architecture, there is no need to safeguard against the "margins" that were required in the earlier architectures like: 1) WL ON to bitline precharge OFF, 2) Bitline precharge ON to WL OFF, 3) Data arriving at the bitline versus the write select in the column mux, etc. These margins used to effectively slow down the memories. The proposed new architecture will be faster as these margins do not exist.

The memory architecture features a bitcell having at least one transistor having a source connected to VSS and with gate controlled by one of WWL, D or DB lines. Further, WWL can have only one passgate per bitcell. The memory architecture also features wherein the D and DB lines encode a data polarity as well as column decode information. For this memory architecture a whole row does not go active, instead only a cross-over bitcell where the WWL and D or DB lines are ON, goes active. Additionally, only one side of the bitcell is accessed where the "write zero" operation is expected to happen. The bitcell access is controlled by combining a row address, a column address, and data polarity information to uniquely determine a bitcell as well as a side of the bitcell that is accessed.

Figure 5:
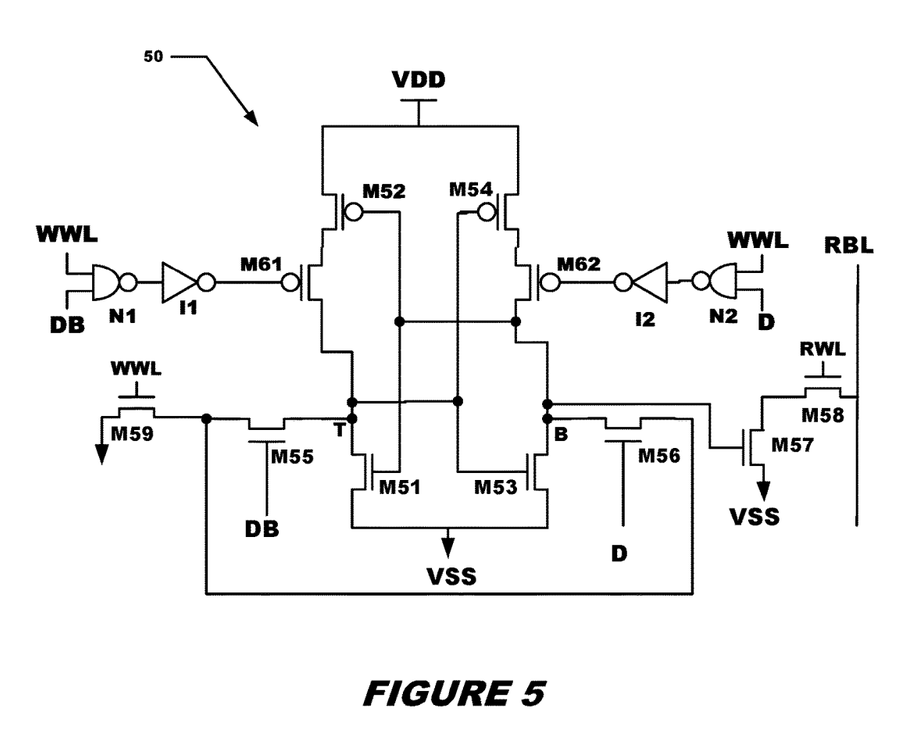
FIG. 5 depicts a schematic diagram of a particular embodiment of a write assist circuit with a bitcell in accordance with a particular embodiment of the present invention.

Referring now to FIG. 5, the technique and method described here proposes a way to "eliminate" the fight between the transistor that is writing into the bitcell and the internal PMOS pullup transistor which is within the bitcell. This technique adds to the individual bitcell area, but as it eliminates the fight between the writing transistor and the pullup PMOS, it guarantees that the write will always happen. So the necessity of the write-assist techniques outside the bitcell is not there, and the uncertainty about the success of the write-assist technique is not there. The conventional write-assist techniques need a huge effort for fine-tuning the circuit for different bitcells, different technology nodes and PDK versions, different PVTs, and different instance sizes. Even after that, the previous techniques remain "statistical" in nature. The proposed technique is not statistical in nature, as it is correct by construction. This is a new idea and a new concept in itself.

Referring now to FIG. 5, one way of implementing the write-assist technique which is local to the proposed new bitcell is shown. The write-assist techniques are required when the write driver and the write pass gate combination is not able to overcome the pull-up PMOS transistor in the bitcell. This mostly happens at the statistically worst case conditions. All previous techniques use one of the two approaches. They either make the write driver and the write pass gate stronger, or they make the bitcell pull-up transistor weaker. But they do not eliminate the fight. The presently described configuration 50 eliminates the fight completely and also at the same time, keeps the latching operation of the bitcell latch intact.

FIG. 5 shows a new bit cell 50 in accordance with the present invention. As shown in FIG. 5, transistor M51 has a gate coupled to a gate of M52, a drain of M53 and a drain of M62 (node B). M51 also has a source connected to VSS and a drain coupled to a drain of M61, a gate of M53 and a gate of M54 (node T). Bit cell 50 also includes M52 having a source coupled to VDD. M53 has a source coupled to VSS. M54 has a source coupled to VDD.

Also included are M55, M56, M57, M58, M59, MM61 and M62. M55 has a gate coupled to Data Bar (DB) and a source coupled to a drain of M59. M55 further includes a drain coupled to node T. M56 has a gate coupled to Data (D) and a drain coupled to node B. M57 has a gate coupled to node B, a source coupled to VSS and a drain coupled to a source of M58. M58 has a gate coupled to a Read Word Line (RWL) and a drain coupled to a Read Bit line (RBL). M59 has a gate coupled to Write Word Line (WWL) and a source coupled to VSS.

M61 has a gate coupled to an output of inverter I1 and a source coupled to a drain of M52. M62 has a gate coupled to an output of inverter I2, a source coupled to a drain of M54, and a drain coupled to node B. Nand gate N1 has an output coupled to an input of inverter I1, a first input coupled to WWL and a second input coupled to DB. Nand gate N2 has an output coupled to an input of inverter I2, a first input coupled to WWL and a second input coupled to D.

As shown in FIG. 5, transistor M61 has been incorporated between M52 and M51. Similarly, transistor M62 has been introduced between transistors M54 and M53. In order to write zero at the node T, then transistors M59 and M55 will be ON as both WWL and DB will be high. The control of M61 is adjusted such that M61 will be OFF when the node T is being pulled low. This eliminates the fight completely. When M61 is OFF, M62 is ON and the bitcell latch action is also working, therefore making sure that the bitcell contents are not at risk. Also, this scheme eliminates the fight only in the bitcell where the data is being written and not on any other bitcell. The contents of all other bitcells are also safe. This scheme will become more and more necessary in advanced technologies where finding a full-proof statistical write-assist technique will become increasingly difficult.

Figure 6:
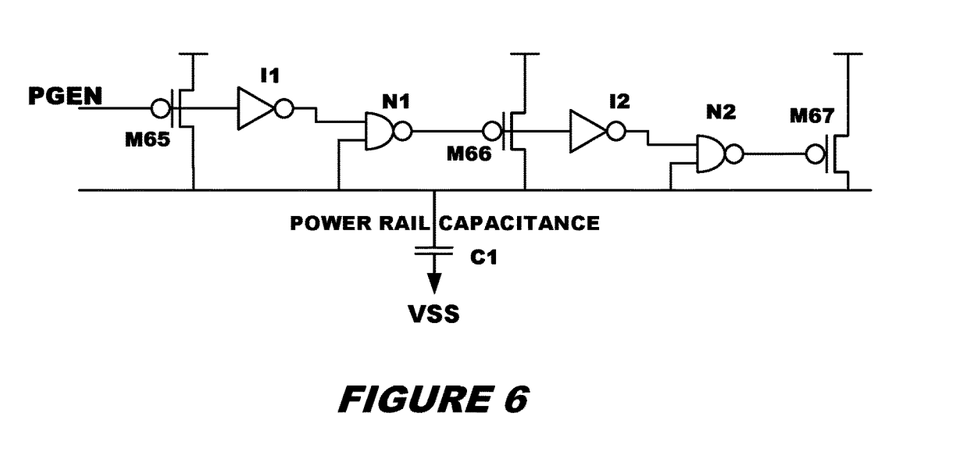
FIG. 6 depicts a schematic diagram of a particular embodiment of a circuit to control in-rush current for a memory cell in accordance with a particular embodiment of the present invention.

FIG. 6 shows a scheme of power switch 60 that will control the in-rush current of a memory instance (or any other circuit) when it goes from the power-down mode to the active mode. Power switch 60 includes a power rail capacitance (shown as C1) between a drain of transistor M65 and ground. M65 has a gate coupled to a PGEN signal and a source coupled to a reference voltage. Inverter I1 has an input coupled to the gate of M65 and an output coupled to a first input of Nand gate N1. Nand gate N1 has a second input coupled to C1 and an output coupled to the gate of M66. M66 has a source coupled to a reference voltage and a drain coupled to C1. Inverter I2 has an input coupled to the gate of M66 and an output coupled to a first input of Nand gate N2. Nand gate N2 has a second input coupled to C1 and an output coupled to the gate of M67. M67 also has a source coupled to a reference voltage and a drain coupled to C1.

In the power-down mode, the voltage on the power rail capacitance goes down significantly. When the memory or any other circuit goes back to the active mode, this power rail capacitance needs to charge back to VDD. If this charging is sudden, then it draws a large amount of current from the power supply and the in-rush current is huge and many times, exceeds the rating that can be handled at the SOC level. There have been some ways of controlling the in-rush current, like using a smaller PMOS header, using a smaller PMOS header first which is then followed by a larger PMOS header, by introducing delays between the gate controls of the PMOS headers so that they turn ON in a staggered way. Introducing the delays using any delay elements is not possible as the gate delays are very small as compared to the total delay requirement.

Current innovation proposes a way of effectively controlling the in-rush current. The voltage of the power rail capacitance itself is used to trigger a NAND that will trigger the next set of PMOS headers. As can be seen from FIG. 6, the trip point of N1 is adjusted to be lower than the trip point of N2 and so on. The sequence of the events is: M65 turns ON when PGEN (Power Gating Enable) signal goes low. The power rails capacitance starts charging and when it reaches the trip point of N1, M66 turns ON. Now, M65 and M66 are working in parallel. When the voltage on C reaches the trip point of N2, transistor M67 turns ON. This will effectively control the in-rush current. The trip point of the NAND can be controlled to have different values using sizing of the transistors, different VT transistors, stacking of the devices, etc. Additional stages can be added as required using an inverter, NAND, and a power switch transistor.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

What is claimed is:

1. A circuit comprising:
    a power rail capacitance between a reference signal and a ground;
    a first transistor having a gate coupled to a control signal, a source coupled to a reference voltage and a drain coupled to said reference signal;
    a sequencing circuit having an input and an output, said sequencing circuit comprising:
        said sequencing circuit input coupled to an input of an inverter;
        a NAND gate having a first input coupled to an output of said inverter, a second input coupled to said reference signal, and an output comprising a sequencing circuit output; and
        a sequencing circuit transistor having a gate coupled to said output of said NAND gate, a source coupled to said reference voltage and a drain coupled to said reference signal.

2. The circuit of claim 1 further comprising at least one additional sequencing circuit coupled in series with said sequencing circuit wherein an input of each of said at least one additional sequencing circuit is coupled to an output of a preceding sequencing circuit.

3. The circuit of claim 1 wherein said first transistor comprises a PFET transistor.

4. The circuit of claim 1 wherein said sequencing circuit transistor comprises a PFET transistor.

5. The circuit of claim 1 wherein a trip point of a first NAND gate is lower than a trip point of a subsequent NAND gate.

* * * * *